(12) United States Patent
Miyamoto et al.

(10) Patent No.: US 6,359,436 B1
(45) Date of Patent: Mar. 19, 2002

(54) SELECTIVE EXCITATION METHOD AND APPARATUS UTILIZING NON-LINEAR ERROR IN A GRADIENT FOR MAGNETIC RESONANCE IMAGING

(75) Inventors: Shoei Miyamoto; Susumu Kosugi, both of Tokyo (JP)

(73) Assignee: GE Yokogawa Medical Systems, Limited, Tokyo (JP)

( * ) Notice: Subject to any disclaimer, the term of this patent is extended or adjusted under 35 U.S.C. 154(b) by 0 days.

(21) Appl. No.: 09/560,528

(22) Filed: Apr. 21, 2000

(30) Foreign Application Priority Data

Jun. 24, 1999 (JP) .............................. 11-177660

(51) Int. Cl.[7] ................................. G01V 3/00
(52) U.S. Cl. ....................... 324/307; 324/309
(58) Field of Search ................... 324/307, 309

(56) References Cited

U.S. PATENT DOCUMENTS 4,651,096 A * 3/1987 Buonocore ................. 324/309
5,545,995 A * 8/1996 Schneider et al. ......... 324/318

* cited by examiner

*Primary Examiner*—Hezron Williams
*Assistant Examiner*—Dixomara Vargas
(74) *Attorney, Agent, or Firm*—Moonray Kojima

(57) ABSTRACT

In order to provide a selective excitation method and apparatus that is not affected by the non-linearity of a gradient magnetic field, and a magnetic resonance imaging method and apparatus employing such a selective excitation apparatus, a frequency f is employed as an RF excitation frequency, corresponding to a slice position $Z_c$ redefined differently from a specified slice position $Z_a$ according to a non-linearity error in a gradient magnetic field Gz. Alternatively, the gradient is adjusted so that the frequency of spins at a specified slice position $Z_a$ equals to a frequency f of the RF excitation signal.

15 Claims, 8 Drawing Sheets

SELECTIVE EXCITATION METHOD AND APPARATUS UTILIZING NON-LINEAR ERROR IN A GRADIENT FOR MAGNETIC RESONANCE IMAGING

BACKGROUND OF THE INVENTION

The present invention relates to a selective excitation method and apparatus and a magnetic resonance imaging method and apparatus, and more particularly to a method and apparatus for selectively exciting spins of atomic nuclei, and a magnetic resonance imaging method and apparatus employing such a selective excitation apparatus.

In magnetic resonance imaging, gradient magnetic fields are generated in a space to be imaged to allow the three-dimensional position of voxels to be identified by frequency of spins of atomic nuclei, such as protons. The generation of the gradient magnetic fields involves generating a static magnetic field a having a uniform magnetic field strength $B_0$ in a field of view (FOV), as exemplarily shown as a profile of the magnetic field strength in FIG. 1, applying a symmetric gradient magnetic field b having a direction on one side and a direction on the other side opposite to each other with respect to the center O of the static magnetic field, and obtaining a composite magnetic field c with a gradient by composing the magnetic fields a and b. To generate the static magnetic field a, a superconductive electromagnet, a normal conductive electromagnet, a permanent magnet or the like is employed. To generate the gradient magnetic field b, a gradient coil is employed having an appropriate loop shape.

Since the frequency of spins linearly varies with a distance Z in the FOV due to the composite magnetic field c having a gradient, a desired slice is selectively excited by appropriately choosing a frequency of an RF (radio frequency) excitation signal, to produce (i.e., reconstruct) a tomographic image based on magnetic resonance signals generated from the slice.

In generating a gradient magnetic field as above, the linearity of the gradient tends to be deteriorated as the distance becomes larger from the center O in the FOV. Although the linearity of the gradient may be improved by carefully designing the loop shape of the gradient coil, there has to be a trade-off between the linearity and other conditions, such as countermeasures against eddy current, and an ideal linearity cannot be always achieved. Accordingly, when a slice is selected at a position away from the center O (i.e., at an offset position), a different slice position from the desired one is excited by using an RF excitation frequency (offset frequency) determined by a nominal gradient magnetic field corresponding to the desired slice position.

SUMMARY OF THE INVENTION

It is therefore an object of the present invention to provide a selective excitation method and apparatus that is not affected by the non-linearity of a gradient magnetic field, and a magnetic resonance imaging method and apparatus employing such a selective excitation apparatus.

In accordance with a first aspect of the invention, there is provided a selective excitation method for selectively exciting spins of atomic nuclei within a subject to be imaged by an RF signal, the selective excitation being effected on a slice position defined at a distance predetermined in relative to a center of a magnetic field space having a gradient, the method comprising the step of employing as the RF signal an RF signal having a frequency corresponding to a slice position redefined differently from the defined slice position according to a non-linearity error in the gradient.

In accordance with a second aspect of the invention, there is provided a selective excitation method for selectively exciting spins of atomic nuclei within a subject to be imaged by an RF signal, the selective excitation being effected on a slice position defined at a distance predetermined in relative to a center of a magnetic field space having a gradient, the method comprising the step of adjusting the gradient so that the frequency of spins at the defined slice position equals the frequency of the RF signal.

In accordance with a third aspect of the invention, there is provided a selective excitation apparatus for selectively exciting spins of atomic nuclei within a subject to be imaged by an RF signal, the selective excitation being effected on a slice position defined at a distance predetermined in relative to a center of a magnetic field space having a gradient, the apparatus comprising RF excitation means employing as the RF signal an RF signal having a frequency corresponding to a slice position redefined differently from the defined slice position according to a non-linearity error in the gradient.

In accordance with a fourth aspect of the invention, there is provided a selective excitation apparatus for selectively exciting spins of atomic nuclei within a subject to be imaged by an RF signal, the selective excitation being effected on a slice position defined at a distance predetermined in relative to a center of a magnetic field space having a gradient, the apparatus comprising gradient adjusting means for adjusting the gradient so that the frequency of spins at the defined slice position equals the frequency of the RF signal.

(Effect)

According to the present invention, an RF signal having a frequency corresponding to a slice position redefined differently from a predefined slice position according to a non-linearity error in the gradient magnetic field is employed as an RF signal for exciting spins. Alternatively, the gradient of the magnetic field is adjusted so that the frequency of spins at the predefined slice position equals the frequency of the RF excitation signal.

Therefore, the present invention can provide a selective excitation method and apparatus that is not affected by the non-linearity of a gradient magnetic field, and a magnetic resonance imaging method and apparatus employing such a selective excitation apparatus.

Further objects and advantages of the present invention will be apparent from the following description of the preferred embodiments of the invention as illustrated in the accompanying drawings.

DETAILED DESCRIPTION OF THE INVENTION

Figure 1:
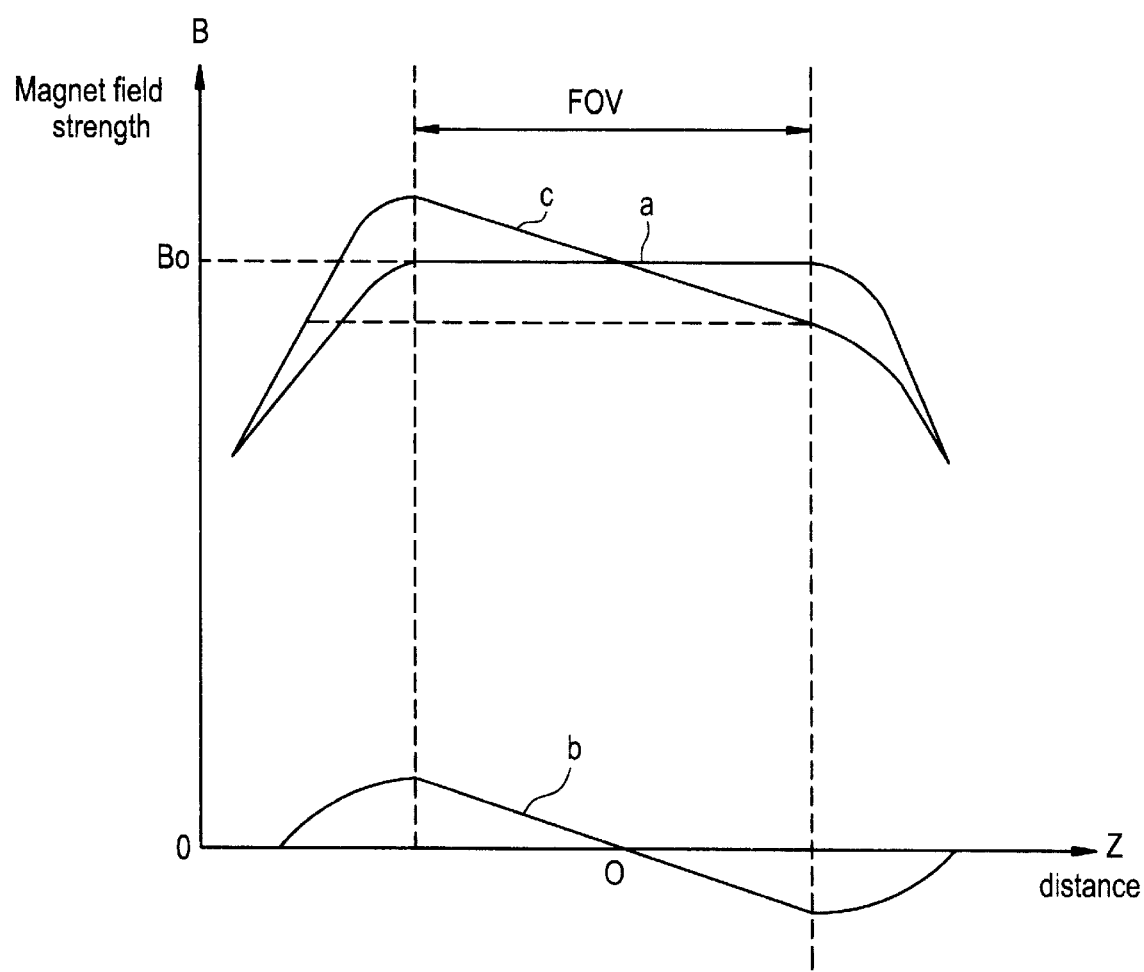
FIG. 1 illustrates a profile of the magnetic field strength in a magnetic resonance imaging apparatus.
Figure 2:
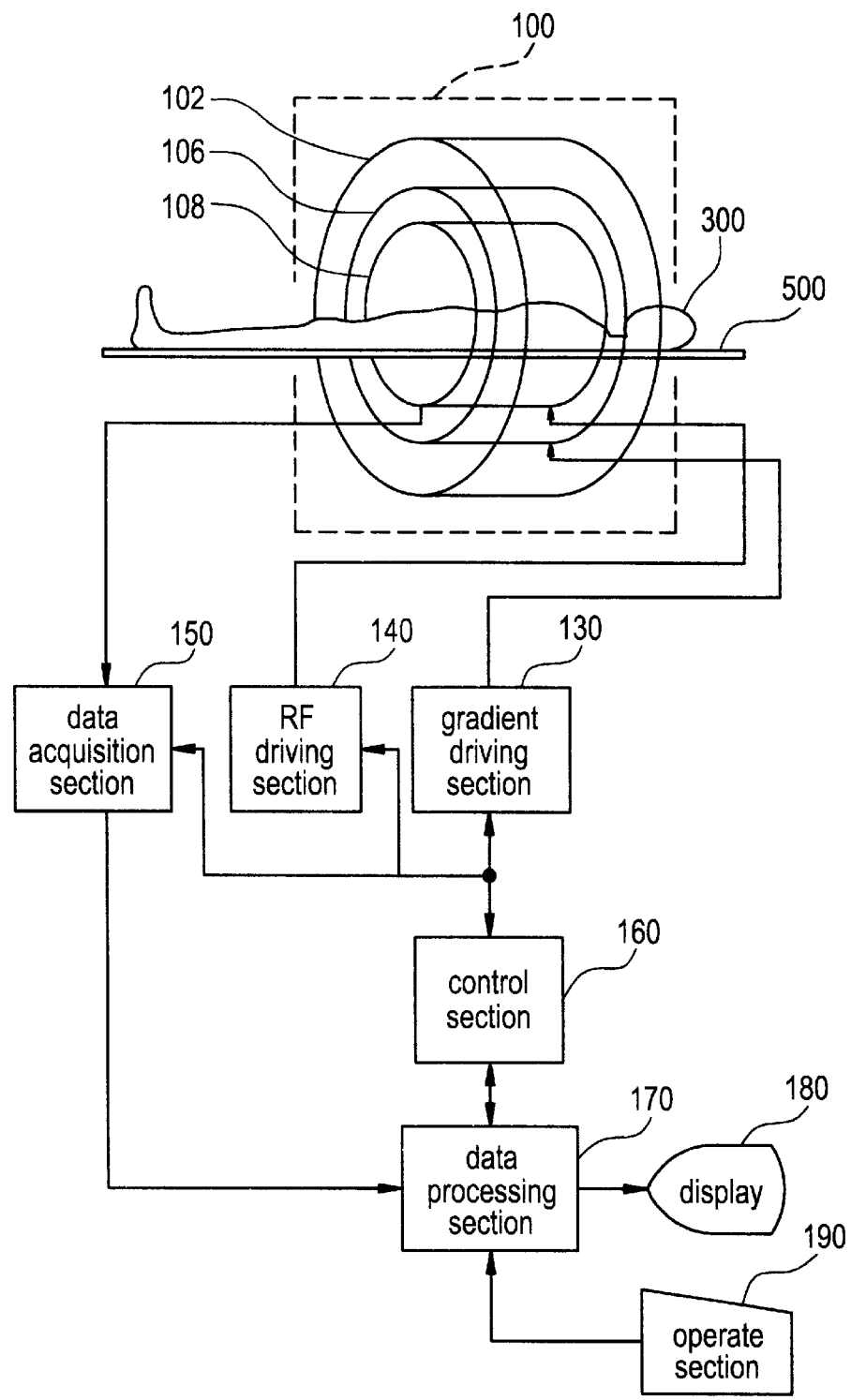
FIG. 2 is a block diagram of an apparatus in accordance with an embodiment of the present invention.

Several embodiments of the present invention will now be described in more detail with reference to the accompanying drawings. FIG. 2 shows a block diagram of a magnetic resonance imaging apparatus, which is an embodiment of the present invention. The configuration of the apparatus represents an embodiment of the apparatus in accordance with the present invention, and the operation of the apparatus represents an embodiment of the method in accordance with the present invention.

As shown in FIG. 2, the present apparatus has a magnet system 100. The magnet system 100 has a main magnetic field coil section 102, a gradient coil section 106 and an RF (radio frequency) coil section 108. These coil sections have a generally cylindrical outer shape and are concentrically disposed. A subject to be imaged 300 is rested on a cradle 500 and carried into and out of the internal space of the magnet system 100 by carrier means (not shown).

The main magnetic field coil section 102 generates a static magnetic field in the internal space of the magnet system 100. The direction of the static magnetic field is generally in parallel with the direction of the body axis of the subject to be imaged 300, i.e., a so-called horizontal magnetic field is generated. The main magnetic field coil section 102 comprises a superconductive coil, for example. It will be easily recognized that the main magnetic field coil section 102 is not limited to comprising a superconductive coil, but may comprise a normal conductive coil or the like.

The gradient coil section 106 generates gradient magnetic fields for imparting gradients to the static magnet field strength. The gradient magnetic fields to be generated include three types of magnetic fields: a slice gradient magnetic field, a readout gradient magnetic field and a phase encoding gradient magnetic field, and the gradient coil section 106 has three gradient coils (not shown) corresponding to these three gradient magnetic fields.

The RF coil section 108 generates a high frequency magnetic field in the static magnetic field space to excite spins within the subject to be imaged 300. The generation of the high frequency magnetic field will be referred to as transmission of an RF excitation signal hereinbelow. The RF coil section 108 also receives an electromagnetic wave generated by the excited spins, i.e., a magnetic resonance signal. The RF coil section 108 has a transmit coil and a receive coil (not shown). The transmit and receive coils may be either the same coil or separate dedicated coils.

The gradient coil section 106 is connected with a gradient driving section 130 for supplying driving signals to the gradient coil section 106 to generate the gradient magnetic fields. The gradient driving section 130 has three driving circuits corresponding to the three gradient coils in the gradient coil section 106. The driving sections will be described in more detail later.

The RF coil section 108 is connected with an RF driving section 140 for supplying driving signals to the RF coil section 108 to transmit the RF excitation signals, thereby exciting the spins within the subject to be imaged 300. The RF driving section 140 will be described in more detail later.

A portion consisting of the gradient coil section 106, gradient driving section 130, RF coil section 108 and RF driving section 140 is an embodiment of the selective excitation apparatus of the present invention. The configuration of the apparatus represents an embodiment of the apparatus in accordance with the present invention, and the operation of the apparatus represents an embodiment of the method in accordance with the present invention.

The RF coil section 108 is also connected with a data acquisition section 150 for gathering signals received by the RF coil section 108 and acquiring the signals as digital data.

The gradient driving section 130, RF driving section 140 and data acquisition section 150 are connected with a control section 160 for controlling these sections 130–150.

The output of the data acquisition section 150 is connected to a data processing section 170. The data processing section 170 stores data gathered from the data acquisition section 150 in a memory (not shown). Thus, a data space is formed in the memory, which constitutes a two-dimensional Fourier space. The data processing section 170 performs an inverse two-dimensional Fourier transformation on the data in the two-dimensional Fourier space to reconstruct an image of the subject 300.

The data processing section 170 is connected to the control section 160. The data processing section 170 is superior to the control section 160 and governs the section 160. The data processing section 170 is connected with a display section 180 that displays the reconstructed image and several information output from the data processing section 170, and an operating section 190 that is operated by a human operator and inputs several commands, information and so forth to the data processing section 170.

Figure 3:
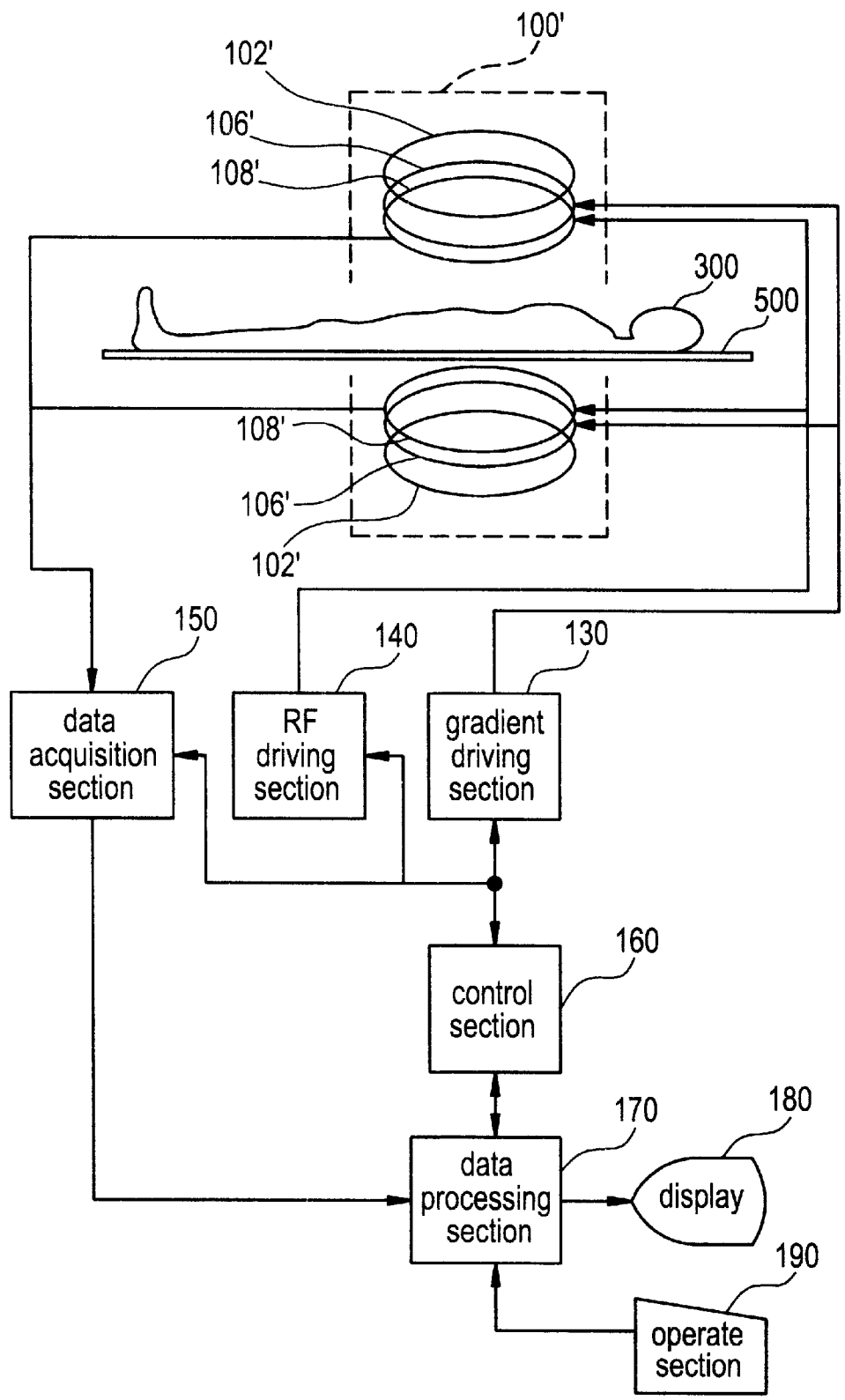
FIG. 3 is a block diagram of an apparatus in accordance with another embodiment of the present invention.

FIG. 3 shows a block diagram of another magnetic resonance imaging apparatus, which is an embodiment of the present invention. The configuration of the apparatus represents an embodiment of the apparatus in accordance with the present invention, and the operation of the apparatus represents an embodiment of the method in accordance with the present invention.

The apparatus shown in FIG. 3 has a different magnet system 100' than the apparatus shown in FIG. 2. Components except the magnet system 100' are configured in a similar manner to those in the apparatus shown in FIG. 2, and similar parts are designated by similar reference numerals and explanation thereof will be omitted.

The magnet system 100' has a main magnetic field magnet section 102', a gradient coil section 106' and an RF coil section 108'. The main magnetic field magnet section 102' and the coil sections 106' and 108' each comprise a pair of respective members facing each other with a space interposed. These sections have a generally disk-like outer shape and are disposed with a common center axis. The subject to be imaged 300 is rested on the cradle 500 and carried into and out of the internal space of the magnet system 100' by carrier means (not shown).

The main magnetic field magnet section 102' generates a static magnetic field in the internal space of the magnet system 100'. The direction of the static magnetic field is generally orthogonal to the direction of the body axis of the subject to be imaged 300, i.e., a so-called vertical magnetic field is generated. The main magnetic field magnet section 102' comprises a permanent magnet, for example. It will be easily recognized that the main magnetic field magnet section 102' is not limited to comprising a permanent magnet, but may comprise a superconductive or normal conductive electromagnet, etc.

The gradient coil section 106' generates gradient magnetic fields for imparting gradients to the static magnet field strength. The gradient magnetic fields to be generated include three types of magnetic fields: a slice gradient magnetic field, a readout gradient magnetic field and a phase encoding gradient magnetic field, and the gradient coil section 106' has three gradient coils (not shown) corresponding to these three gradient magnetic fields.

The RF coil section 108' transmits an RF excitation signal to the static magnetic field space to excite spins within the subject to be imaged 300. The RF coil section 108' also receives a magnetic resonance signal generated by the excited spins. The RF coil section 108' has a transmit coil and a receive coil (not shown). The transmit and receive coils may be either the same coil or separate dedicated coils.

Figure 4:
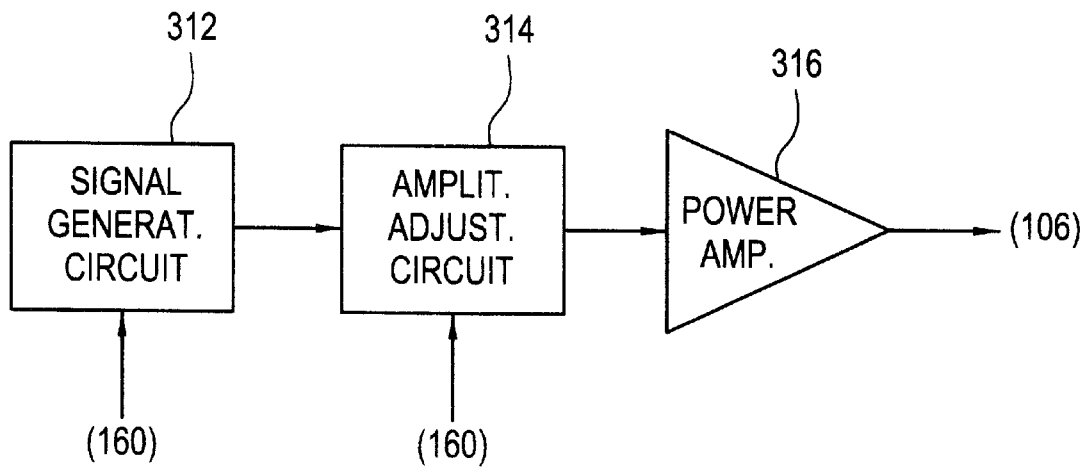
FIG. 4 is a block diagram of the gradient driving section in the apparatus shown in FIG. 2 or 3.

FIG. 4 shows a block diagram of one of the driving circuits in the gradient driving section 130, such as a driving circuit for a slice gradient coil. As shown, the driving circuit has a signal generation circuit 312 for generating a gradient coil driving signal having a predetermined waveform. The generation of the gradient coil driving signal is controlled by the control section 160.

The gradient coil driving signal is adjusted in amplitude by an amplitude adjusting circuit 314. The amount of the amplitude to be adjusted by the amplitude adjusting circuit 314 is controlled by the control section 160. A portion consisting of the amplitude adjusting circuit 314 and control section 160 is an embodiment of the gradient adjusting means of the present invention. The amplitude-adjusted gradient coil driving signal is power-amplified by a power amplifier 316 and supplied to the slice gradient coil in the gradient coil section 106.

Figure 5:
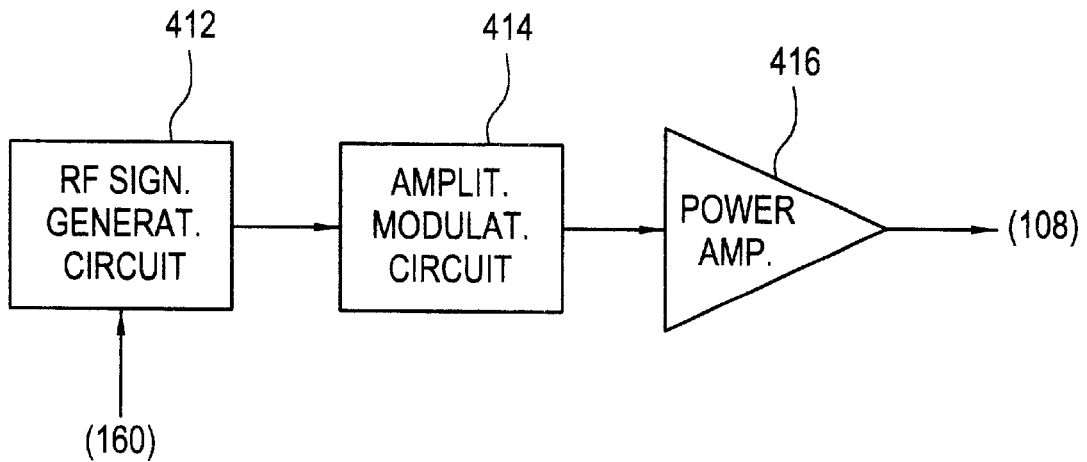
FIG. 5 is a block diagram of the RF driving section in the apparatus shown in FIG. 2 or 3.

FIG. 5 shows a block diagram of the RF driving section 140. As shown, the driving section has an RF signal generation circuit 412. In the RF signal generation circuit 412, the signal generation timing and RF signal frequency are controlled by the control section 160. The generated RF signal is modulated in amplitude in an amplitude modulation circuit 414, power-amplified by a power amplifier 416 and supplied to the RF coil section 108.

A portion consisting of the RF signal generation circuit 412, amplitude modulation circuit 414, power amplifier 416, RF coil section 108 and control section 160 is an embodiment of the RF excitation means of the present invention.

Figure 6:
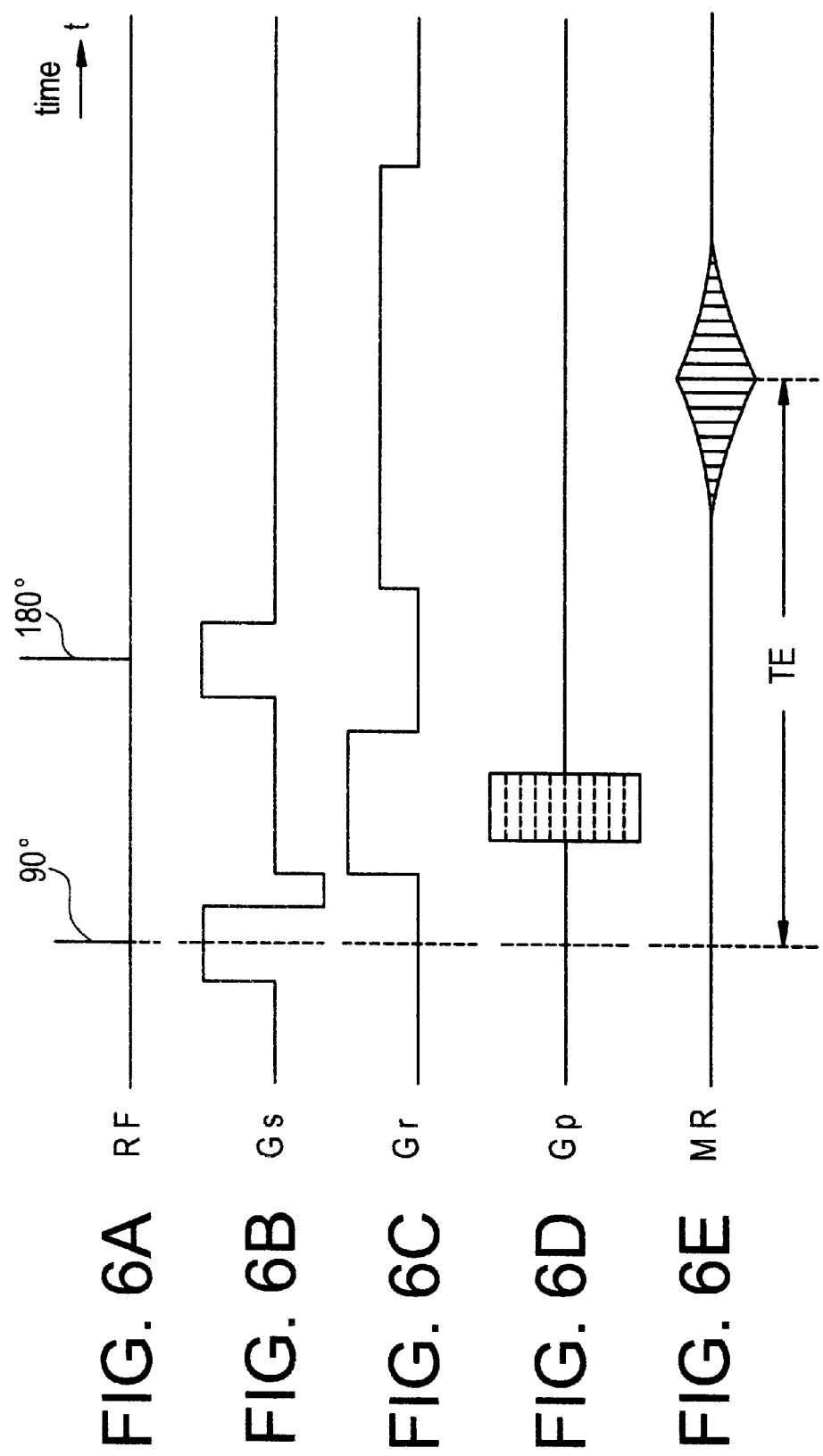
FIG. 6 illustrates an exemplary pulse sequence executed by the apparatus shown in FIG. 2 or 3.

Now the operation of the present apparatus will be described. The operation of the apparatus shown in FIG. 2 and that shown in FIG. 3 have no substantial difference. The operation of the apparatus proceeds under control of the control section 160. FIG. 6 shows an exemplary pulse sequence for use in magnetic resonance imaging. The illustrated pulse sequence is one for a spin echo (SE) technique.

Specifically, (1) is a sequence of 90° and 180° pulses for RF excitation of the SE technique, and (2), (3), (4) and (5) are sequences of a slice gradient Gs, a readout gradient Gr, a phase encoding gradient Gp and a spin echo MR, respectively, of the SE technique. It should be noted that the 90° and 180° pulses are represented by their respective central signals. The pulse sequence proceeds from the left to the right along a time axis t.

As shown, the 90° pulse results in 90° excitation of the spins. At the same time, the slice gradient Gs is applied to achieve selective excitation for a certain slice. After a predetermined time from the 90° excitation, 180° excitation by the 180° pulse, or spin inversion, is performed. Again, the slice gradient Gs is applied at the same time to achieve selective inversion for the same slice.

During the period between the 90° excitation and spin inversion, the readout gradient Gr and phase encoding gradient Gp are applied. The readout gradient Gr dephases the spins, and the phase encoding gradient Gp phase-encodes the spins.

After the spin inversion, the spins are rephased by the readout gradient Gr to generate a spin echo MR. The spin echo MR is an RF signal having a symmetric waveform with respect to the echo center. The central echo occurs after TE (echo time) from the 90° excitation. The spin echo MR is collected by the data acquisition section 150 as view data.

Such a pulse sequence is repeated 128–256 times in a cycle of TR (repetition time). The phase encoding gradient Gp is varied for each repetition to provide different phase encoding each time. Thus, view data for 128–256 views are obtained.

Figure 7:
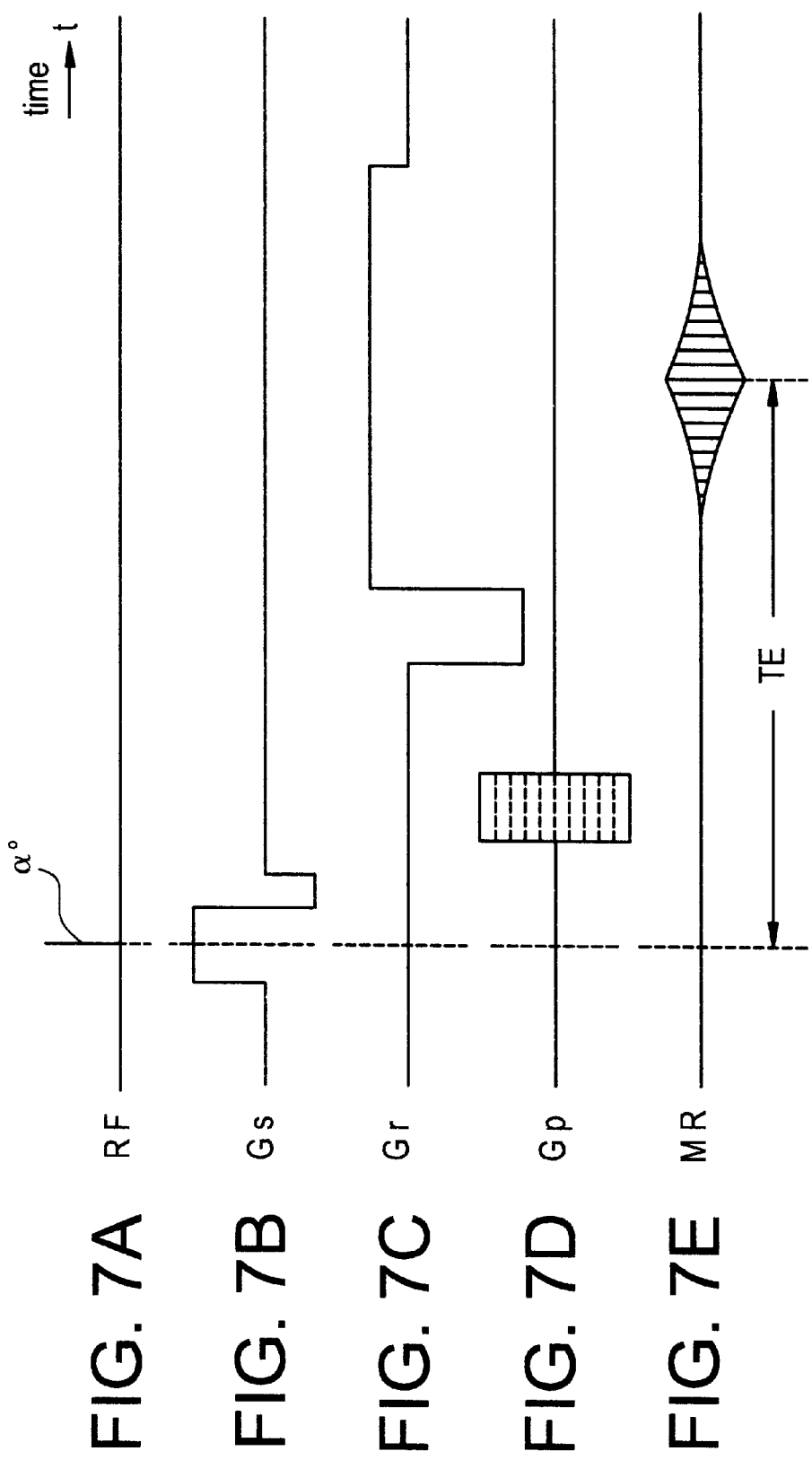
FIG. 7 illustrates another exemplary pulse sequence executed by the apparatus shown in FIG. 2 or 3.

Another example of the pulse sequence for magnetic resonance imaging is shown in FIG. 7. This pulse sequence is one for a gradient echo (GRE) technique.

Specifically, (1) is a sequence of an α° pulse for RF excitation of the GRE technique, and (2), (3), (4) and (5) are sequences of a slice gradient Gs, a readout gradient Gr, a phase encoding gradient Gp and a gradient echo MR, respectively, of the GRE technique. It should be noted that the α° pulse is represented by its central signal. The pulse sequence proceeds from the left to the right along a time axis t.

As shown, the α° pulse results in α° excitation of the spins, wherein α is not greater than 90. At the same time, the slice gradient Gs is applied to achieve selective excitation for a certain slice.

After the α° excitation, the spins are phase-encoded by the phase encoding gradient Gp. Next, the spins are first dephased and are subsequently rephased by the readout gradient Gr to generate a gradient echo MR. The gradient echo MR is an RF signal having a symmetric waveform with respect to the echo center. The central echo occurs after TE from the α° excitation.

The gradient echo MR is collected by the data acquisition section 150 as view data. Such a pulse sequence is repeated 128–256 times in a cycle of TR. The phase encoding gradient Gp is varied for each repetition to provide different phase encoding each time. Thus, view data for 128–256 views are obtained.

The view data obtained by the pulse sequence of FIG. 6 or 7 are collected into the memory in the data processing section 170. It will be easily recognized that the pulse sequence is not limited to the SE or GRE technique, but may be of any other appropriate technique such as a fast spin echo (FSE) technique. The data processing section 170 performs an inverse two-dimensional Fourier transformation on the view data to reconstruct a tomographic image of the subject 300. The reconstructed image is displayed by the display section 180 as a visual image.

Figure 8:
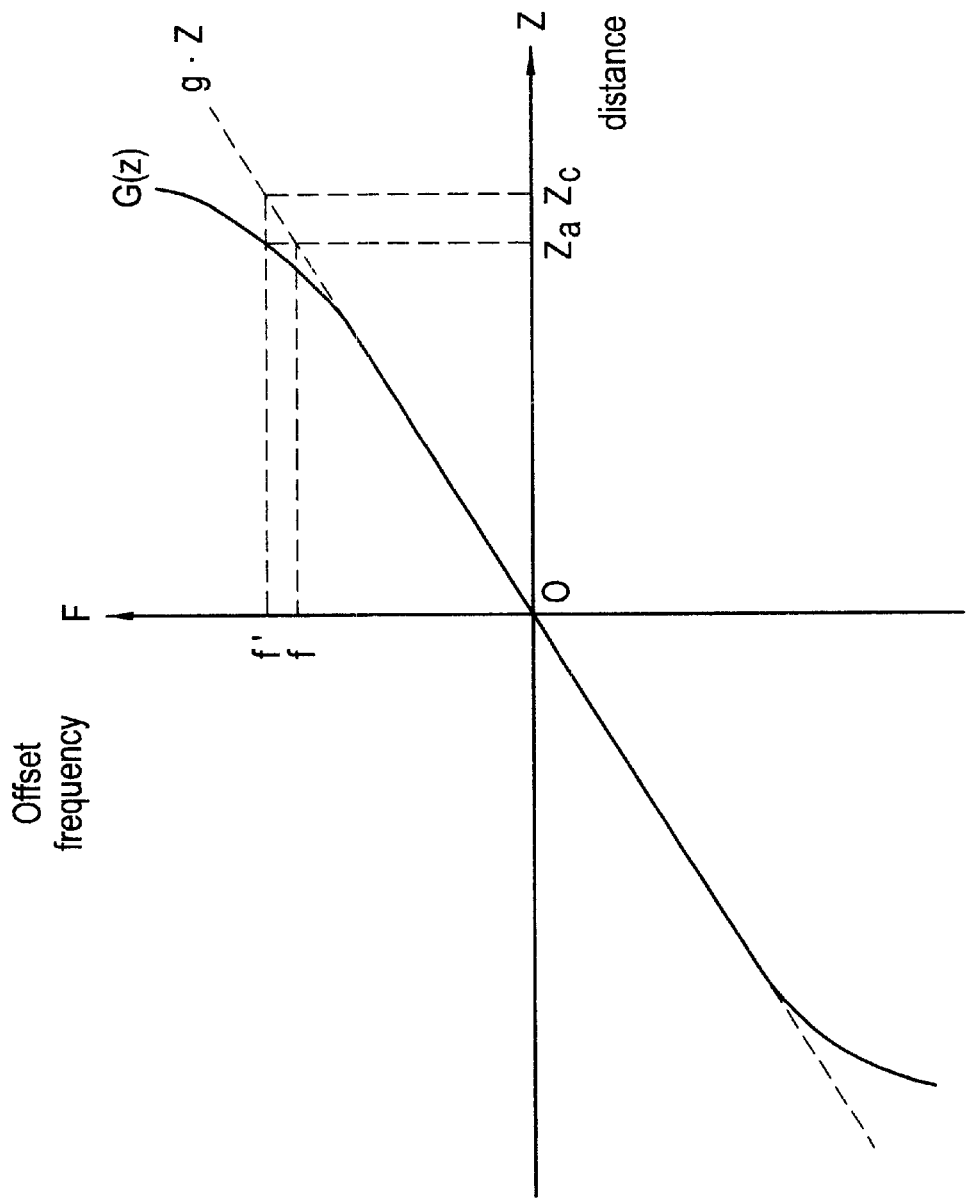
FIGS. 8 and 9 are graphic representation illustrating an offset frequency in the apparatus shown in FIG. 2 or 3.

The offset frequency in the direction orthogonal to the slice plane is exemplarily shown in FIG. 8 when the slice gradient Gs contains a non-linearity error in the above apparatus. Specifically, a gradient G(Z) has an increasing error from a proper linear gradient g·Z (nominal gradient) with a larger distance from the magnetic field center O, and the offset frequency F exhibits the same non-linearity accordingly.

If a human operator defines a slice position at an offset distance $Z_a$, for example, under the above condition, the control section 160 controls the RF signal generation circuit 412 to change the frequency of the RF excitation signal into a frequency f corresponding to an offset distance $Z_c$ under the nominal gradient g·Z. The distance $Z_c$ is calculated by the following equation:

$$Z_c = \frac{G(Z_a)}{g}, \quad (1)$$

wherein:

$G(Z_a)$: a strength of a gradient magnetic field at a distance $Z_a$, and g: a nominal magnetic field gradient.

$G(Z_a)$ is calculated based on the known non-linearity of the slice gradient Gs. The value of g is known.

Thus, the offset frequency f can be expressed by the following equation:

$$f = \gamma \cdot g \cdot Z_c = \gamma \cdot G(Z_a)' \qquad (2)$$

wherein $\gamma$ is a gyromagnetic ratio. The RF excitation frequency is thus adjusted to a frequency for the offset distance $Z_a$, thereby allowing exact excitation of a slice at the offset distance $Z_a$.

Figure 9:
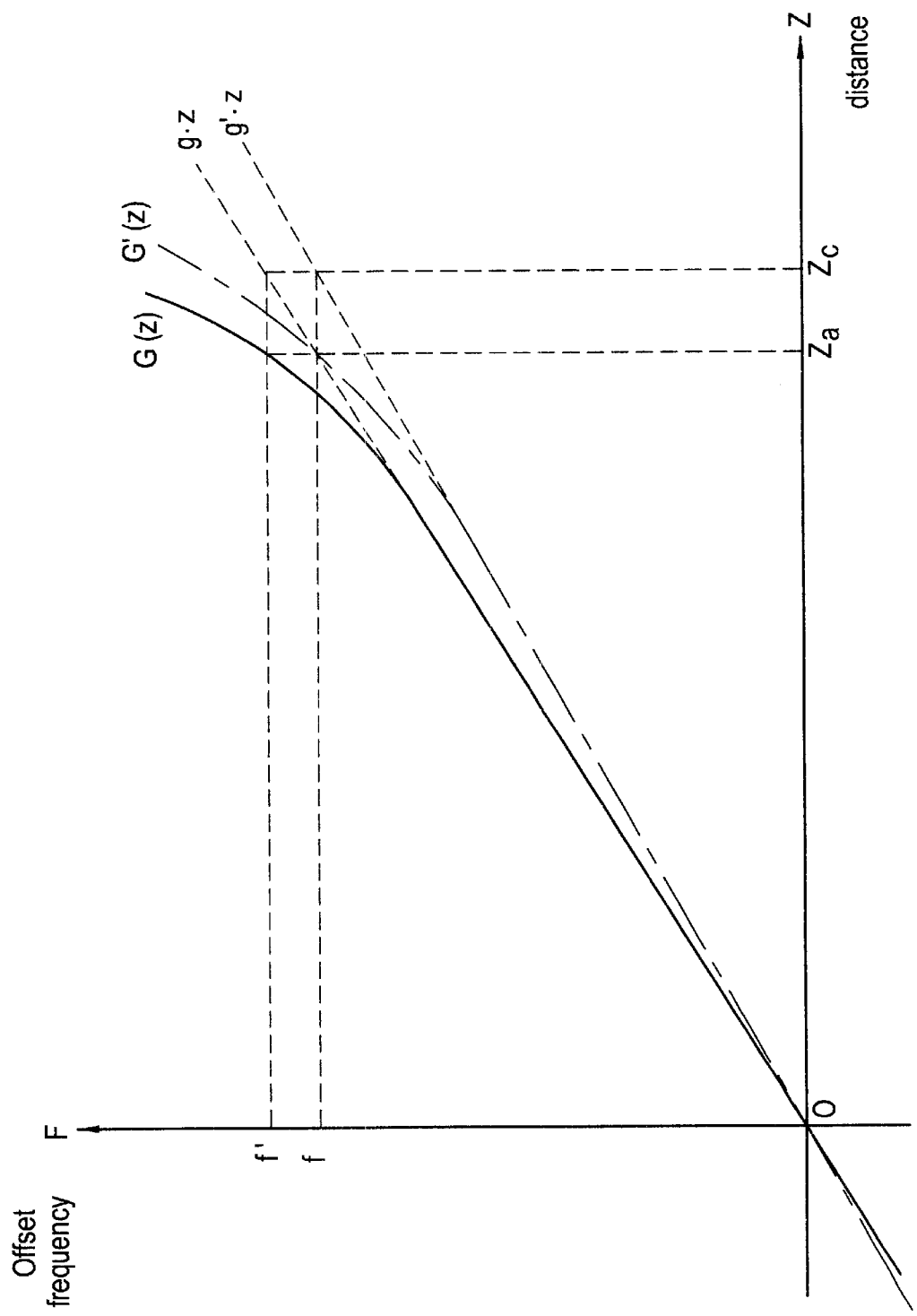

Alternatively, the gradient magnetic field may be adjusted to make the frequency of the spins equal to the frequency of the RF excitation signal, instead of adjusting the frequency of the RF excitation signal. Specifically, the frequency for exciting the offset distance $Z_a$ is $f=\gamma \cdot g \cdot Z_a$ under a nominal slice gradient g, as shown in FIG. 9. Then, the control section 160 adjust the amplitude of a gradient driving signal via the amplitude adjusting circuit 314 to change the nominal gradient into a value g', which is calculated by the following equation:

$$g' = \frac{Z_a}{Z_c} g. \qquad (3)$$

The nominal gradient g' according to Eq. (3) is a value that makes the magnetic field strength $g' \cdot Z_c$ (nominal) at the offset distance $Z_c$ equal to the magnetic field strength $g \cdot Z_a$ (nominal) at the offset distance $Z_a$ under the nominal gradient g. The change of the gradient results in an actual gradient of G' (z). The relationship among G(Z), G' (Z), g and g' is given by the following equation:

$$G'(Z_a) = \frac{g'}{g} G(Z_a). \qquad (4)$$

In this condition, the frequency f is:

$$f = \gamma \cdot g' \cdot Z_c. \qquad (5)$$

Substituting the relationship of Eq. (1) into $Z_c$ gives:

$$f = \gamma \cdot g' \cdot \frac{G(Z_a)}{g}, \qquad (6)$$

and substituting the relationship of Eq. (4) gives:

$$f = \gamma \cdot G'(Z_a). \qquad (7)$$

That is, the frequency of the spins at the offset distance $Z_a$ is made equal to the frequency of the RF excitation signal f under the actual gradient G' (Z) after the change. This allows exact excitation of a slice at the offset distance $Z_a$.

The preceding description is made on a method of adjusting an RF excitation frequency or a gradient magnetic field when the non-linearity error in the gradient is uniform within an slice plane. However, if the non-linearity error of the gradient is not uniform within the slice plane, the similar adjustment to above may be performed based on the non-linearity within a region of interest (ROI) in the slice plane.

Many widely different embodiments of the invention may be configured without departing from the spirit and the scope of the present invention. It should be understood that the present invention is not limited to the specific embodiments described in the specification, except as defined in the appended claims.

What is claimed is:

1. In an excitation method for magnetic resonance imaging, comprising the steps of:
    applying a gradient signal to a subject being examined and positioned in a magnetic field center;
    applying an RF signal to said subject to selectively excite spins of atomic nuclei within said subject, said selective excitation being effective on a slice position defined at a predetermined distance relative to said magnetic field center having a gradient; the improvement comprising:
    detecting a non-linear error in said gradient; and
    based on said detected non-linear error, controlling frequency of said RF signal or controlling said gradient signal, so that at said slice position or frequency of spin at said slice position substantially equals said frequency of RF signal determined for that slice position.

2. The method of claim 1, wherein said frequency of said RF signal is modulated so that a slice position is selected that is for a frequency of RF signal at which said non-linear error is taken into account.

3. The method of claim 1, wherein amplitude of said gradient signal is adjusted so that frequency of spin at said slice position is substantially equal to frequency of said RF signal which results in said slice position.

4. The method of claim 1, wherein said non-linear error is uniform within a slice plane.

5. The method of claim 1, wherein said non-linear error is detected within a region of interest in a slice plane.

6. An excitation apparatus for exciting spins of atomic nuclei in magnetic resonance imaging, said apparatus comprising:
    means for applying a gradient signal to a subject being examined and positioned in a magnetic field center;
    means for applying an RF signal to said subject to selectively excite spins of atomic nuclei within said subject, said selective excitation being effective on a slice position defined at a predetermined distance relative to said magnetic field center having a gradient;
    means for detecting a non-linear error in said gradient; and
    means for controlling, based on said detected non-linear error, frequency of said RF signal or said gradient signal, so that at said slice position or frequency of spin at said slice position substantially equals said frequency of RF signal determined for that slice position.

7. The excitation apparatus of claim 6, wherein said means for controlling comprises means for modulating frequency of said RF signal so that a slice position is selected that is for a frequency of RF signal at which said non-linear error is taken into account.

8. The excitation apparatus of claim 6, wherein said means for controlling comprises means for adjusting amplitude of said gradient signal so that frequency of spin at said slice position is substantially equal to frequency of said RF signal which results in said slice position.

9. The excitation apparatus of claim 6, wherein said means for detecting comprises means for detecting said non-linear error which is uniform in a slice plane.

10. The excitation apparatus of claim 6, wherein said means for detecting comprises means for detecting non-linear error within a region of interest only in a slice plane.

11. An MRI apparatus comprising:
    means for applying a static magnetic field to a subject under examination and positioned in a magnetic field center;

means for applying a gradient signal to said subject;

means for applying an RF signal to said subject to selectively excite spins of atomic nuclei within said subject, said selective excitation being effective on a slice position defined at a predetermined distance relative to said magnetic field center and having a gradient;

means for detecting a non-linear error in said gradient; and means for controlling, based on said detected non-linear error, frequency of said RF signal or said gradient signal, so that at said slice position or frequency of spin at said slice position substantially equals said frequency fo RF signal determined for that slice position.

12. The MRI apparatus of claim 11, wherein said means for controlling comprises means for modulating frequency of said RF signal so taht a slice position is selected that is for a frquency of RF signal at which said non-linear error is taken into account.

13. The MRI apparatus of claim 11, wherein said means for controlling comprises means for adjusting amplitude of said gradietn signal so that frequency of spin at said slice position is substantially equal to frequency of said RF signal which results in said slice position.

14. The MRI apparatus of claim 11, wherein said means for detecting comprises means for detecting said non-linear error which is uniform in a slice plane.

15. The MRI apparatus of claim 11, wherein said means for detecting comprises means for detecting non-linear error within a region of interst only in a slice plane.

* * * * *